United States Patent [19]

Ohmura et al.

[11] 4,220,707

[45] Sep. 2, 1980

[54] EPOXY RESIN COMPOSITION FOR IMAGE FORMATION

[75] Inventors: Kaoru Ohmura; Kiichiro Sasaguri; Kazuo Toyomoto, all of Fuji, Japan

[73] Assignee: Asahi Kasei Kogyo Kabushiki Kaisha, Osaka, Japan

[21] Appl. No.: 898,793

[22] Filed: Apr. 24, 1978

Related U.S. Application Data

[62] Division of Ser. No. 639,768, Dec. 11, 1975, abandoned.

[30] Foreign Application Priority Data

Dec. 20, 1974 [JP] Japan .................. 49-145732

[51] Int. Cl.$^2$ .................. G03C 5/00; G03C 1/68
[52] U.S. Cl. .................. 430/325; 204/159.22; 204/159.24; 204/159.11; 430/280; 430/919; 430/927
[58] Field of Search .................. 96/75.1, 115 R, 115 P, 96/91 R, 75; 204/159.11, 159.14, 159.22, 159.24; 260/2 EP, 2 EC, 2 N, 47 EP, 18 EP, 29.2 EP

[56] References Cited

U.S. PATENT DOCUMENTS

| | | | |
|---|---|---|---|
| 3,709,861 | 1/1973 | Anderson | 260/47 EC |
| 3,721,617 | 3/1973 | Watt | 204/159.11 |
| 3,817,850 | 6/1974 | Feinberg | 204/159.11 |
| 3,951,769 | 4/1976 | Schlesinger | 204/159.11 |
| 3,956,043 | 5/1976 | Zahir et al. | 96/35.1 X |
| 3,977,878 | 8/1976 | Roteman | 96/86 P |
| 3,980,483 | 9/1976 | Nishikubo et al. | 96/115 R |
| 3,989,610 | 11/1976 | Tsukada et al. | 204/159.15 |

FOREIGN PATENT DOCUMENTS

1105772 3/1965 United Kingdom .
1155408 8/1966 United Kingdom .

*Primary Examiner*—Edward C. Kimlin
*Attorney, Agent, or Firm*—Armstrong, Nikaido, Marmelstein & Kubovcik

[57] ABSTRACT

An epoxy resin composition comprising an epoxy compound having an average of one or more epoxy groups per molecule, an amine curing agent and a reductive metal compound or complex can produce excellent developed color images, and concave-convex images by energy irradiation. The epoxy resin composition can give excellent physical, chemical and electrical properties to the formed images and various inorganic and organic materials can be used as substrate.

6 Claims, No Drawings

EPOXY RESIN COMPOSITION FOR IMAGE FORMATION

This is a division of application Ser. No. 639,768, filed Dec. 11, 1975, now abandoned.

This invention relates to an epoxy resin composition for image formation having not only good sensitivity and resolving power, and excellent adhesiveness, solvent resistance, heat resistance, mechanical strength, surface hardness, and electrical properties, but also good image stability and no influence of inhibitory effect of oxygen, and to a method for forming developed color images and concave-convex images using said epoxy resin composition.

Heretofore various image forming materials and photosensitive resins have been proposed. For example, an image forming material using a polymer such as poly(methyl methacrylate) or the like as a binder is proposed but it has various problems in adhesiveness, solvent resistance, image stability, and the like. An image forming material using a halogenated hydrocarbon such as carbon tetrabromide, or the like has various problems in storage stability, toxicity, and the like after the manufacture due to volatility of the halogenated hydrocarbon. Photosensitive resins applying addition to the double bonds generally have various problems in adhesiveness, solvent resistance, heat resistance, mechanical strength, surface hardness, electrical properties, inhibitory effect of oxygen, and the like. In Japanese Patent Publication 67398/73 there is disclosed a photosensitive epoxy resin composition using a halogenated hydrocarbon as photoactivating agent and a tertiary amine as curing agent, but since the halogenated hydrocarbon is used, there are many problems as mentioned above in toxicity, storage stability, chemical resistance, and the like, and further developed color images cannot be obtained using said resin composition.

Therefore an image forming material having excellent image formation, adhesiveness, solvent resistance, heat resistance, mechanical strength, surface hardness and electrical properties has long been desired.

It is an object of this invention to provide an epoxy resin composition for image formation having excellent properties as mentioned above overcoming various defects of conventional image forming materials. It is another object of this invention to provide a method for forming developed color image and/or concave-convex images using the epoxy resin composition of the invention. Further objects and advantages of this invention will be apparent to one skilled in the art from the accompanying disclosure and discussion.

The present invention provides an epoxy resin composition for image formation comprising an epoxy compound having an average of one or more epoxy groups per molecule, an amine curing agent and a reductive metal compound or complex.

One of features of the present invention is that since the epoxy compound is used as a base material, the formed image is excellent in adhesiveness, solvent resistance, heat resistance, mechanical strengths, surface hardness and electrical properties, and various materials such as metals, glasses, ceramics, wood, paper, resin plates, films, cloth, concrete, mortar and other inorganic plates can be used as a substrate to form images thereon. Another features of the present invention is that fixing is possible only by cure with heating. Further when a primary or secondary amine is used as a curing agent, non-exposure parts are not colored during a long period of storage, stability of the image formed is excellent and no toxicity is shown due to the reaction with the epoxy compound. Still further features of the present invention is that it is possible to obtain developed color images, concave images, convex images, and combination of these images. In the case of forming concave or convex images, it is necessary to wash out uncured parts.

The epoxy compound used in the present invention is that having an average of one or more epoxy groups per molecule and the rest of the molecule being a carbon chain or carbon chains having one or more ether bonds, ester bonds, amino bonds, and the like. Such an epoxy compound is disclosed, for example, in Chapters 3 and 4 of Hiroshi Kakiuchi "Epoxy Resins" Shoko-do, Japan, published in 1970. These epoxy resins can be prepared by reacting a polyvalent alcohol such as ethylene glycol, glycerin, trimethylolpropane, or the like, a polyvalent phenol such as resorcinol, hydroquinone, catechol, phloroglycinol, or the like, a polyphenol such as 2,2-bis-(4-hydroxyphenyl)-propane, 4,4'-dihydroxydiphenylmethane, a novolac resin, or the like, a polycarboxylic acid such as p-hydroxybenzoic acid, terephthalic acid, or the like, and an amine compound such as toluidine, or the like with an excess amount of an epoxide such as an epihalohydrin, an alkylene oxide, or the like. These epoxy resins are disclosed, for example, in U.S. Pat. No. 2,592,560. Among these epoxy compounds, bisphenol A (or F) type epoxy resins, novolac type epoxy resins and glycidyl (meth)acrylate (co)-polymers are particularly suitable for use in the present invention. The bisphenol A type epoxy resin of the formula,

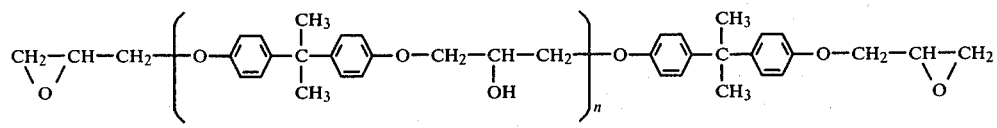

wherein n is from zero to about 10 in average, obtained by reacting bisphenol A with epichlorohydrin, the bisphenol F type epoxy resin of the formula,

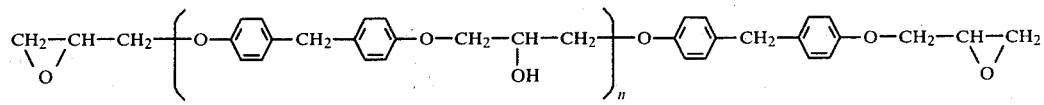

wherein n is from zero to about 10 in average, obtained by reacting bisphenol F with epichlorohydrin, and the novolac type epoxy resin of the formula,

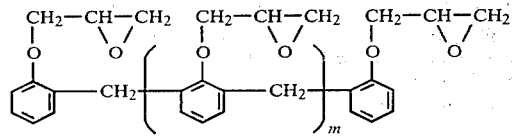

wherein m is from zero to about 5 in average, are particularly preferable among these epoxy resins. A glycidyl (meth)acrylate polymer or copolymer of glycidyl (meth)acrylate with other (meth)acrylate, styrene, acrylonitrile or the like (the glycidyl (meth)acrylate content being 5–95% by weight) can also be used preferably. When the metal compound or complex insoluble in an organic solvent is used as a component of the present composition, the use of the epoxy resins soluble in water such as diglycidyl ethers of polyethylene glycol, and the like are preferable. In general, solid epoxy resins having high molecular weight are preferable as the epoxy compound.

The amine curing agents used in the present invention include, for example, aliphatic amines and their derivatives such as hexamethylenediamine, triethylenetetramine, bis(hexamethylene)triamine, dimethylaminopropylamine, aminoethylethanolamine, methyliminobispropylamine, 4-aminomethyl-1,8-diaminooctane, xylylenediamine, N,N,N',N'-tetramethyl-1,3-butanediamine, triethanolamine, 2-dimethylamino-2-hydroxypropane, benzyldimethylamine, 2-(dimethylaminomethyl)phenol, 2,4,6-tris(dimethylaminomethyl)phenol; aromatic amines and their derivatives such as phenylenediamine, diaminodiphenyl ether, diaminodiphenylmethane, diaminodiphenyl sulfone, 4,4'-bis(o-toluidine), 4,4'-thiodianiline, toluylenediamine, m-aminobenzylamine, methylaniline, diphenylamine, N,N'-diphenyl-p-phenylenediamine, dimethylaniline, diethylaniline, and N,N,N',N'-tetramethyl-p-phenylenediamine; alicyclic amines and their derivatives such as menthanediamine, 1,3-diaminocyclohexane, and isophoronediamine; heterocyclic amines and their derivatives such as N-aminoethylpiperazine, 2,6-diaminopyridine, N-methylpiperazine, hydroxyethylpiperazine, piperidine, pyrrolidine, morpholine, N,N'-dimethylpiperazine, N-methylmorpholine, hexamethylenetetramine, N,N-bis[(2-hydroxy)propyl]piperazine, triethylenediamine, pyridine, piperazine, quinoline, α,α'-dipyridyl, and o-phenanthroline.

Amine curing agents which are stable at a lower temperature or room temperature when mixed with the epoxy resins and are able to cure the epoxy resins immediately with heating are preferably used. If it is difficult to cure the epoxy resins with heating, amines curing at room temperature are used and mixed with the epoxy resins immediately before the mixture is coated. In this case, an image is formed first by energy irradiation, then the irradiation is stopped and curing is carried out at room temperature.

In the case of forming developed color images by developing color on the irradiated parts with energy irradiation, amine curing agents such as aromatic primary amines and aromatic secondary amines which can take a conjugated structure on the irradiated parts and develope color, or those which can form chelates with metal ions reduced by irradiation and develope color, e.g. α,α'-dipyridyl, and o-phenanthroline, are preferably used.

In the case of forming concave-convex images which are produced by making the parts irradiated with energy uncured, curing the parts not irradiated with energy and washing out the uncured parts (the term "positive type concave-convex image" is used for these images in the present invention), aromatic primary and secondary amines having a substituent at the para position, aromatic tertiary amines, aliphatic amines, alicyclic amines and heterocyclic amines are preferably used as amine curing agents.

In the case of forming concave-convex images which are produced by curing the parts irradiated with energy, retaining the parts not irradiated with energy uncured, and washing out the uncured parts (the term "negative type concave-convex image" is used for these images in the present invention), aromatic primary and secondary amines having no substituent at the para position are preferably used as amine curing agents.

Although mechanism of forming both the positive and negative types of images are not clear, it seems that major factors are difference in reactivities of the metal compound or complex and the amine at the time of energy irradiation and difference in reaction products produced. Even though an aromatic primary or secondary amine having no substituent at the para position is used, both the positive and negative types of images can be formed due to differences in heating conditions after energy irradiation, i.e. the negative type image can be formed under mild heating conditions and the positive type image can be formed under violent heating conditions.

When primary and secondary amines are used as curing agent, the compounding ratio of the amine curing agents to the epoxy resin is 1 mole of active hydrogen per mole of the epoxy group. When a tertiary amine is used as a curing agent, a catalytic amount of it is compounded because of having no active hydrogen. The compounding ratio, however, can widely be changed depending on easiness of image formation and physical properties of cured products. Generally the amine curing agent can be used in an amount of 0.5–70 parts by weight, preferably 1–50 parts by weight, per 100 parts by weight of the epoxy resin.

As the reductive metal compound or complex, that having the formula, $$M-X_n$$

wherein M is silver, copper, lead, thallium, iron, cobalt, manganese, platinum, vanadium, tellurium, or uranyl; X is halogen or carboxylate; and n is an integer of 1 to 4, can be used. Examples of the reductive metal compounds which reduce by energy irradiation are silver chloride, silver bromide, silver iodide, cuprous chloride, cupric chloride, cupric bromide, lead iodide, lead chloride, thallium bromide, thallium iodide, thallium chloride, ferric chloride, ferric bromide, ferric iodide, cobalt chloride, cobalt bromide, cobalt iodide, manganese chloride, manganese bromide, manganese iodide, platinum tetrabromide, vanadium chloride, tellurium chloride, ferric oxalate, ferric tartrate, ferric citrate, cobalt oxalate, manganese oxalate, uranyl oxalate, lead acetate, and the like. It is also possible, to use complexes of the metal compounds mentioned above with ligands such as acetyl acetone or polar solvents.

When the epoxy compound dissolved in an organic solvent is used, the metal compound which has almost no toxicity and can be dissolved in the organic solvent, e.g. ferric chloride, ferric bromide, cupric chloride, cupric bromide, cobalt chloride, cobalt bromide, cobalt iodide, manganese chloride, manganese bromide, manganese iodide, or the like, is preferably used. Particularly the use of ferric chloride is more preferable.

The metal compound or complex is used in an amount of 0.1 to 10 moles, preferably 0.5 to 5 moles per mole of the amine curing agent.

The present epoxy resin composition may contain alcohols such as benzyl alcohol, and the like, phenols such as pyrogallol, gallic acid, and the like, ferrocene, acetophenone, phenanthrenequinone, and other conventional sensitizer and the like.

Another excellent method for sensitizing the curing (or non-curing) reaction with energy irradiation is to use a photoconductive substance such as zinc oxide. More illustratively, sensitized images can be obtained by placing a photoconductive layer containing zinc oxide and a binder on a layer of metal, e.g. aluminum, having greater ionization tendency than the metal used in the present composition, and further placing a layer of the present composition thereon to prepare an image forming material, irradiating energy thereon to form irradiated parts and non-irradiated parts in the present composition and at the same time conductive parts and non-conductive parts in the zinc oxide, carrying out electrochemical reaction so that the reaction at the irradiated parts of the present composition may proceed.

It is preferable to use the present composition in substantially dissolved state using a proper solvent. As the solvent, there may be used, for example, methyl ethyl ketone, chloroform, ethylene glycol monoethyl ether, tetrahydrofuran, dioxane, ethyl acetate, ethylene glycol monoethyl acetate and the like. Viscosity of the resulting solution of the present composition can be adjusted depending on the desired thickness of the resulting coating. The solution of the present composition can be coated on a substrate by spraying, a dipping process, or using a roller, or other conventional processes.

Image formation using the present composition is carried out applying energy irradiation. As the energy sources, there may be used, for example, a mercury vapor lamp, a tungusten lamp, a xenon lamp, a laser beam, an electron beam, and the like.

One embodiment of an image forming process according to the present invention is as follows.

The epoxy resin composition is coated on a substrate and dried until substantially non-viscous state is obtained and then exposed to energy irradiation, for example, ultraviolet rays from a 200 to 500-watt mercury vapor lamp, under the desired patterns. The exposure time may be sufficient for about 10 seconds to 10 minutes, but more longer time may be employed without any troubles. Particularly when an aromatic primary or secondary amine or an amine which can form a chelate with the reduced metal is used, developed color images can be formed by only energy irradiation. After exposing to the ultraviolet rays, the resin is cured with heating or at room temperature and fixed. In the case of obtaining negative type concave-convex images, the uncured parts are washed out immediately after the exposure or after a short time of heating. In the case of obtaining positive type concave-convex images, the non-exposure regions are cured with heating at 60°–200° C. for about 5–50 minutes or at room temperature and the uncured parts are washed out. The time required for washing out with a solvent depends on the period of exposure to ultraviolet rays and the degree of cure before washing out, but generally is between about 30 seconds and 5 minutes. If necessary, further heating after washing out may be applied to make curing completely. As mentioned above, curing conditions for obtaining negative type concave-convex images are quite different from those for obtaining positive type concave-convex images. In general, excellent positive type concave-convex images can be obtained, since differences between the height of projecting parts and that of concave parts are great.

Examples of the solvent used for washing out include ketones such as acetone, methyl ethyl ketone, and the like, halogenated hydrocarbons such as chloroform, and the like, ethers such as ethylene glycol monoethyl ether, tetrahydrofuran, dioxane, and the like, esters such as ethyl acetate, ethylene glycol monoethyl acetate, and the like.

Since the epoxy resin composition for image formation of the present invention is not only good in sensitivity and resolving power but also excellent in mechanical strengths, adhesive strength, surface hardness, chemical resistance, heat resistance and electrical properties when it is cured, it can be used as printing materials for letterpress, intaglio, lithography and silk screen printings and as photo resists for producing multilayer circuit. Further metals, glasses, ceramics, wood, paper, resin plates, films, cloth, concrete, mortar and other inorganic plates can be used as a substrate and using a series of procedures of coating, energy irradiation, curing, and, if necessary, washing out, images can be produced on these materials. For example, the present epoxy resin composition can be used as coating material and image forming agent for dial plates of various instruments such as clocks or used in automobiles, and the like, ornaments and accessories, woodgrain printing, decorative laminated sheets, cans, bottles, and the like. If desired, the image can be coated with metals using vacuum metallizing or low-temperature cathode sputtering technique. It is also possible to bond pigments such as print ink, and the like on the concave-convex image. In these cases, the adhesion is excellent. In the case of imparting inflammability to the present epoxy resin composition, antimony oxide or the like is added thereto, or brominated bisphenol A type resin is used as the epoxy compound.

The present epoxy resin composition may contain, if required, such additives as an extender, a reinforcing agent, a filler, and the like, e.g. glass fiber, asbestos fiber, boron fiber, cellulose, polyethylene powder, polypropylene powder, quartz flour, mineral silicate such as mica, asbestos dust, and slate dust, kaolin, aluminum oxide (trihydrate), aluminum hydroxide, chalk flour, plaster, calcium carbonate, bentonite (Bentone), silica aerosol, lithophone, titanium dioxide, graphite, and the like.

The present invention is further illustrated by the following examples. In these examples, all parts are given as parts by weight unless otherwise specified.

EXAMPLE 1

A solution containing 10 parts of epoxy resin AER-664 (manufactured by Asahi Kasei Kogyo Kabushiki Kaisha, a bisphenol A type resin, epoxide equivalent 900–1000), 0.274 part of $\alpha,\alpha'$-dipyridyl, 0.951 part of ferric chloride and 40 parts of methyl ethyl ketone was coated on a glass plate in 0.05 mm thick and dried. Then the coating was exposed to ultraviolet irradiation from a 500-watt mercury lamp at a distance of 30 cm for 10 minutes using a negative having the desired pattern. There was obtained the developed red color image. Then the coating was heated at 150° C. for 30 minutes and washed with acetone to give the image in which the exposed parts were engraved 5 microns deep.

EXAMPLE 2

A solution containing 10 parts of epoxy resin AER-664 (manufactured by Asahi Kasei Kogyo Kabushiki Kaisha), 0.349 part of o-phenanthroline, 0.951 part of ferric chloride and 40 parts of methyl ethyl ketone was treated and exposed to ultraviolet irradiation as described in Example 1. There was obtained the developed red color image. Then the coating was heated at 150° C. for 30 minutes and washed with acetone to give the image in which the exposed parts were engraved 5 microns deep.

EXAMPLE 3

A solution containing 20 parts of epoxy resin AER-661 (manufactured by Asahi Kasei Kogyo Kabushiki Kaisha, a bisphenol A type resin, epoxide equivalent 450–500), 2.659 parts of the reaction product of 17.3 parts of 4-aminomethyl-1,8-diaminooctane and 10.6 parts of acrylonitrile, 5.15 parts of ferric chloride and 40 parts of chloroform was treated and exposed to ultraviolet irradiation as described in Example 1. Then the coating was heated at 130° C. for 20 minutes and washed with acetone to give the image in which the exposed parts were engraved 20 microns deep.

EXAMPLE 4

A solution containing 10 parts of epoxy resin AER-664 (manufactured by Asahi Kasei Kogyo Kabushiki Kaisha), 0.274 part of $\alpha,\alpha'$-dipyridyl, 0.951 part of ferric chloride and 40 parts of methyl ethyl ketone was coated on a polyethylene terephthalate film in 0.05 mm thick and dried. The the coating was exposed to ultraviolet irradiation as described in Example 1. There was obtained the developed red color image. Then the coating was heated at 150° C. for 30 minutes and washed with acetone to give the image in which the exposed parts were engraved 5 microns deep.

EXAMPLE 5

A mixture of 37.5 parts of glycidyl methacrylate, 50 parts of butyl acrylate, 162.5 parts of methyl methacrylate and 10 parts of azobisisobutyronitrile was dropped into 250 parts of toluene under reflux in nitrogen stream in a period of 2.5 hours and the reaction was continued additional 3 hours. After the reaction, the toluene was removed under reduced pressure. The thus obtained product (20 parts) together with 0.687 part of $\alpha,\alpha'$-dipyridyl and 2.38 parts of ferric chloride was dissolved in 40 parts of methyl ethyl ketone to give a solution, which was coated on a aluminum plate the surface of which has been treated by anodic oxidation in 0.05 mm thick and dried. Then the coating was exposed to ultraviolet irradiation as described in Example 1 to give the developed red color image. Then the coating was heated at 150° C. for 30 minutes and washed with acetone to give the image in which the exposed parts were engraved 10 microns deep.

EXAMPLE 6

A solution containing 10 parts of epoxy resin AER-664 (manufactured by Asahi Kasei Kogyo Kabushiki Kaisha), 0.522 part of 4,4'-diaminodiphenylmethane, 1.56 parts of ferric bromide and 40 parts of methyl ethyl ketone was treated and exposed to ultraviolet irradiation as described in Example 1. There was obtained the developed bluish green color image. The coating was then heated at 150° C. for 30 minutes and washed with acetone to give the image in which the exposed parts were engraved 10 microns deep.

EXAMPLE 7

A solution containing 10 parts of epoxy resin AER-664 (manufactured by Asahi Kasei Kogyo Kabushiki Kaisha), 0.285 part of metaphenylenediamine, 1.18 parts of cupric bromide and 40 parts of methyl ethyl ketone was treated and exposed to ultraviolet irradiation as described in Example 1. There was obtained the developed dark brown color image. The coating was then heated at 110° C. for 30 minutes and washed with acetone to give the image in which the non-exposed parts were engraved 5 microns deep.

EXAMPLE 8

A solution containing 10 parts of epoxy resin DEN-438 (manufactured by Dow Chemical Co., a novolac type resin, epoxide equivalent 176–181), 2.33 parts of methylene blue, 1.68 parts of tellurium tetrachloride and 20 parts of ethylene glycol monoethyl ether was treated as described in Example 1 and then exposed to the condensed light from 18.6 mW of helium-neon laser at the rate of 5 cm/sec. Then the coating was heated at 150° C. for 30 minutes and washed with acetone to give the image in which the color of methylene blue was faded and the exposed parts were engraved 5 microns deep.

EXAMPLE 9

A solution containing 10 parts of epoxy resin DER-732 (manufactured by Dow Chemical Co., a polyethylene glycol type resin, epoxide equivalent 305–335), 1.04 parts of o-phenanthroline, 2.24 parts of ferric ammonium oxalate and 20 parts of water was treated as described in Example 1 and then exposed to the light from a 500-watt tungusten lamp. There was obtained the developed red color image. Then the coating was heated at 150° C. for 30 minutes and washed with acetone to give the image in which the exposed parts were engraved 5 microns deep.

EXAMPLE 10

A solution containing 10 parts of epoxy resin AER-661 (manufactured by Asahi Kasei Kogyo Kabushiki Kaisha), 0.548 part of $\alpha,\alpha'$-dipyridyl, 1.902 parts of ferric chloride and 20 parts of methyl ethyl ketone was treated as described in Example 1 and then exposed to electron beams emitted from an electron beam irradiating apparatus, voltage 30 kV and current $8 \times 10^{-8}$ A, at the rate of 20 msec/2 mm. There was obtained the developed red color image. Then the coating was heated at 150° C. for 30 minutes and washed with acetone to give the image in which the exposed parts were engraved 10 microns deep.

EXAMPLE 11

A solution containing 10 parts of epoxy resin AER-664 (manufactured by Asahi Kasei Kogyo Kabushiki Kaisha), 0.286 part of α,α'-dipyridyl, 0.992 part of ferric chloride and 40 parts of methyl ethyl ketone was treated and exposed to ultraviolet irradiation as described in Example 1. There was obtained the developed red color image. Then the coating was heated at 170° C. for 60 minutes and washed with acetone to give the image in which the exposed parts were engraved 5 microns deep.

The thus obtained image was immersed in a solvent as mentioned below for 2 days and an increasing rate of weight was measured. The results obtained are as shown in Table 1.

Table 1

| Solvent | Increasing rate of weight (%) |
| --- | --- |
| n-Hexane | 0.3 |
| Isopropyl alcohol | 0.7 |
| Toluene | 0.1 |
| n-Butyl acetate | 0.5 |
| Methyl isobutyl ketone | 0.5 |
| Diacetone alcohol | 2.2 |

Comparative Example 1

A solution containing 10 parts of epoxy resin AER-664 (manufactured by Asahi Kasei Fogyo Kabushiki Kaisha), 0.09 part of N,N,N',N'-tetramethylbutanediamine, 0.25 part of carbon tetrabromide and 40 parts of methyl ethyl ketone was treated and exposed to ultraviolet irradiation as described in Example 1. There was not obtained a developed color image. Then the coating was heated at 170° C. for 60 minutes and washed with acetone to give the image in which the exposed parts were engraved 2 microns deep.

The thus obtained image was immersed in a solvent as listed in Table 2 for 2 days and an increasing rate of weight was measured. The results obtained are as shown in Table 2.

Table 2

| Solvent | Increasing rate of weight (%) |
| --- | --- |
| n-Hexane | 0.5 |
| Isopropyl alcohol | 1.0 |
| Toluene | 1.2 |
| n-Butyl acetate | 49.4 |
| Methyl isobutyl ketone | 42.1 |
| Diacetone alcohol | 60.3 |

What is claimed is:

1. A process for forming concave-convex images which comprises
    applying a coating of an organic solvent solution containing an epoxy resin composition comprising (a) an epoxy compound having an average of one or more epoxy groups per molecule, (b) an amine curing agent selected from the group consisting of aromatic primary amines, aromatic secondary amines, aromatic tertiary amines, aliphatic amines, heterocyclic amines and alicyclic amines, and (c) a reductive metal compound selected from the group consisting of cupric bromide, ferric chloride, ferric bromide, tellurium tetrachloride, and ferric ammonium oxalate on a substrate,
    drying the said coating, exposing the dried coating to energy irradiation,
    curing the resulting coating with heating or at room temperature, and
    removing the uncured parts with a solvent.
2. A process according to claim 1 wherein the reductive metal compound is ferric chloride.
3. A process according to claim 1 or 2 wherein the curing is carried out at a temperature of 60° to 200° C. for 5 to 60 minutes.
4. A process according to claim 1 or 2 wherein the curing is carried out at a temperature of 110° to 170° C. for 20 to 60 minutes.
5. A process according to claim 1 or 2 wherein the epoxy compound is a bisphenol A or F type epoxy resin, a novolac type epoxy resin or a glycidyl acrylate or methacrylate polymer or copolymer.
6. A process according to claim 1 or 2 wherein the amine curing agent is used in an amount of 0.5 to 70 parts by weight per 100 parts by weight of the epoxy compound and the reductive metal compound is used in an amount of 0.1 to 10 moles per mole of the amine curing agent.

* * * * *